United States Patent
Barkow et al.

(10) Patent No.: US 12,490,415 B2
(45) Date of Patent: Dec. 2, 2025

(54) APPARATUS HAVING A PULSE INVERTER

(71) Applicant: Dr. Ing. h.c. F. Porsche Aktiengesellschaft, Stuttgart (DE)

(72) Inventors: Maximilian Barkow, Stuttgart (DE); Daniel Knoblauch, Leonberg (DE); Timijan Velic, Weissach (DE); Jonas Ottolin, Karlsruhe (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 230 days.

(21) Appl. No.: 18/337,458

(22) Filed: Jun. 20, 2023

(65) Prior Publication Data
US 2023/0422434 A1    Dec. 28, 2023

(30) Foreign Application Priority Data
Jun. 28, 2022    (DE) ............ 10 2022 115 995.7

(51) Int. Cl.
*H05K 7/20*    (2006.01)
*B60K 11/02*    (2006.01)

(52) U.S. Cl.
CPC .......... *H05K 7/20927* (2013.01); *B60K 11/02* (2013.01)

(58) Field of Classification Search
None
See application file for complete search history.

(56) References Cited

U.S. PATENT DOCUMENTS

| | | | |
|---|---|---|---|
| 6,487,998 B1* | 12/2002 | Masberg | H02P 29/0016 123/192.1 |
| 2006/0174642 A1 | 8/2006 | Nagashima et al. | |
| 2008/0101013 A1 | 5/2008 | Nelson et al. | |
| 2018/0010836 A1* | 1/2018 | Hirahara | F25B 49/022 |
| 2023/0057989 A1* | 2/2023 | Heusler | H02K 5/02 |
| 2023/0249520 A1* | 8/2023 | Turudic | B60H 1/00385 165/201 |
| 2023/0363122 A1* | 11/2023 | Velic | H02K 11/33 |
| 2023/0397380 A1* | 12/2023 | Wachter | B60L 50/60 |

(Continued)

FOREIGN PATENT DOCUMENTS

| | | |
|---|---|---|
| CN | 101282075 B | 11/2015 |
| DE | 102006005545 A1 | 11/2006 |
| DE | 102007050417 B4 | 11/2009 |

(Continued)

*Primary Examiner* — Courtney L Smith
(74) *Attorney, Agent, or Firm* — LEYDIG, VOIT & MAYER, LTD.

(57) ABSTRACT

An apparatus including a first housing and a pulse inverter, wherein the pulse inverter is arranged in the first housing, and includes first high-voltage components. The first housing includes a first coolant chamber and a second coolant chamber. The second coolant chamber is fluidically isolated from the first coolant chamber. The first coolant chamber includes a first coolant. The first coolant is a dielectric coolant. The first high-voltage components are arranged in the first coolant chamber. The first housing includes a first coolant port and a second coolant port. The first coolant port is in fluid communication with the second coolant port via the second coolant chamber in order to allow a fluid flow of a second coolant from the first coolant port via the second coolant chamber to the second coolant port.

20 Claims, 3 Drawing Sheets

(56) References Cited

U.S. PATENT DOCUMENTS

2024/0291354 A1* 8/2024 Gramann ............. H05K 7/1432

FOREIGN PATENT DOCUMENTS

| | | |
|---|---|---|
| DE | 102012111489 A1 | 5/2014 |
| DE | 102018216397 A1 | 3/2020 |
| DE | 102021106008 B3 | 3/2022 |
| DE | 102020105925 B4 * | 9/2024 ............. B60L 58/26 |
| EP | 2555606 A1 | 2/2013 |

* cited by examiner

APPARATUS HAVING A PULSE INVERTER

CROSS REFERENCE TO RELATED APPLICATIONS

This application claims benefit to German Patent Application No. DE 10 2022 115 995.7, filed on Jun. 28, 2022, which is hereby incorporated by reference herein.

FIELD

The invention relates to an apparatus having a pulse inverter.

BACKGROUND

DE 10 2006 005 545 A1 discloses a cooling assembly for an integrated electric motor inverter with a dielectric coolant fluid.

EP 2 555 606 A1 discloses a cooling assembly with a housing wall for a rectifier module, which cooling assembly is filled with a dielectric fluid and in which the housing wall comprises cooling channels that are perfused by water.

DE 10 2007 050 417 B4 discloses a power module with a self-contained cooling system comprising a circulating dielectric fluid and a further coolant.

DE 10 2018 216 397 A1 discloses a power electronics for an electrically driven vehicle comprising a power semiconductor and a heat tube for dissipating a heat loss generated in the operation of the power electronics, wherein the heat tube comprises a housing filled with an electrically non-conductive working fluid in which the power semiconductor is arranged, and wherein a cooling apparatus is arranged on the housing.

CN 101 282 075 B discloses an inverter, which is cooled by means of a cooling apparatus according to the heat pipe principle.

DE 10 2012 111 489 A1 discloses a cooling apparatus for a power electronics, which cooling apparatus comprises a housing with a heat exchanger perfused by a coolant and a cooling chamber filled with a cooling fluid, in which cooling chamber the power electronics are arranged.

DE 10 2021 106 008 B3 discloses a power electronics module for a rectifier, which has a heat sink for cooling a power-electronic component, wherein a dielectric fluid evaporates on this component.

SUMMARY

In an embodiment, the present disclosure provides an apparatus comprising a first housing and a pulse inverter, wherein the pulse inverter is arranged in the first housing, and comprises first high-voltage components. The first housing comprises a first coolant chamber and a second coolant chamber. The second coolant chamber is fluidically isolated from the first coolant chamber. The first coolant chamber comprises a first coolant. The first coolant is a dielectric coolant. The first high-voltage components are arranged in the first coolant chamber. The first housing comprises a first coolant port and a second coolant port. The first coolant port is in fluid communication with the second coolant port via the second coolant chamber in order to allow a fluid flow of a second coolant from the first coolant port via the second coolant chamber to the second coolant port.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
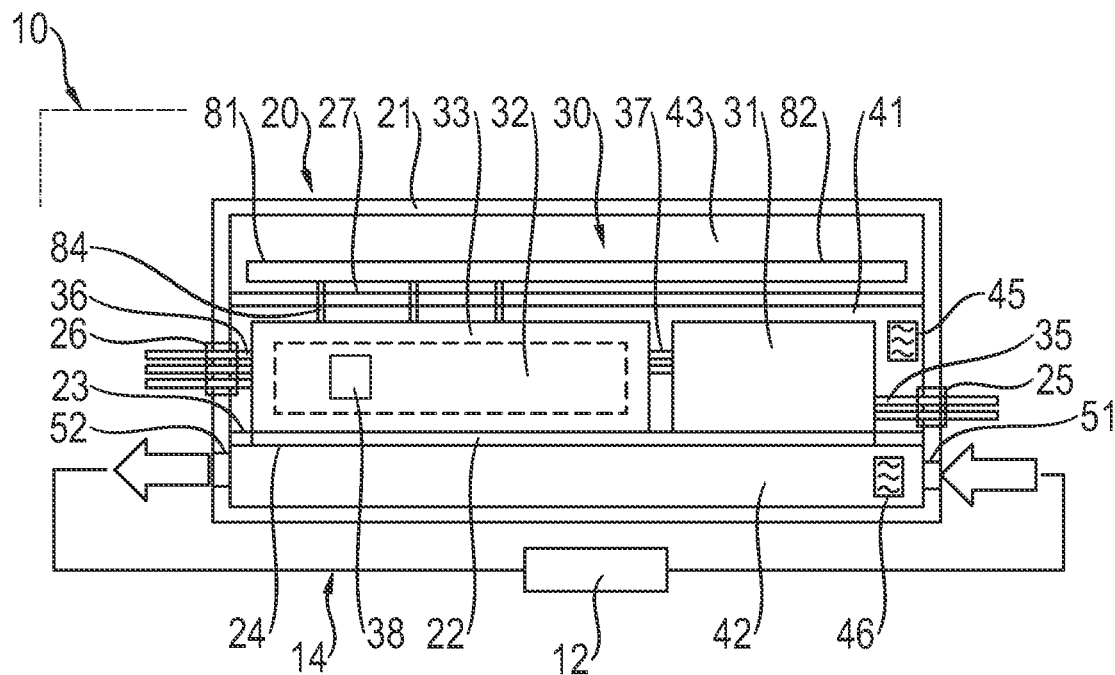
FIG. 1 illustrates, in a schematic longitudinal section, an embodiment of an apparatus with a pulse inverter.

In an embodiment, the present invention provides a new apparatus having a pulse inverter.

An apparatus comprises a first housing and a pulse inverter, which pulse inverter is arranged in the first housing, and comprises first high-voltage components, which first housing comprises a first coolant chamber and a second coolant chamber, which second coolant chamber is fluidically isolated from the first coolant chamber, which first coolant chamber comprises a first coolant, which first coolant is a dielectric coolant, which first high-voltage components are arranged in the first coolant chamber, which first housing comprises a first coolant port and a second coolant port, which first coolant port is in fluid communication with the second coolant port via the second coolant chamber in order to allow a fluid flow of a second coolant from the first coolant port via the second coolant chamber to the second coolant port.

The dielectric coolant enables an advantageous cooling of the high-voltage components, and, via the second coolant chamber, a connection to a possibly existing further cooling system is possible. This allows for an effective cooling of the pulse inverter. In addition, the first coolant does not have to be used in further apparatuses to be cooled or in the entire system, but rather can be used locally.

According to a preferred embodiment, the first high-voltage components comprise at least one high-voltage component from a first group consisting of:
  power module,
  semiconductor switch,
  semiconductor switch activation apparatus,
  control apparatus,
  first electrical conduit,
  intermediate circuit capacitor,
  current sensor, and
  filter assembly.

These are high-voltage components that either generate heat or are heat-sensitive and therefore benefit from the cooling.

According to a preferred embodiment, the first high-voltage components comprise at least one high-voltage component from the first group comprising a coating configured so as to bring about a protection of the high-voltage component against the first coolant. Although dielectric coolants have no or little short circuit hazard, it can be advantageous for some high-voltage components to have additional protection.

According to a preferred embodiment, a second coolant is provided in the second coolant chamber. A second coolant allows for an advantageous cooling of the first coolant or high-voltage components.

According to a preferred embodiment, the second coolant comprises a dielectric coolant or a non-dielectric coolant. In certain applications, dielectric coolants can be advantageous as a second coolant in order to protect electrical components against a short circuit.

According to a preferred embodiment, the apparatus comprises a first partition, which first partition is provided between the first coolant chamber and the second coolant chamber in order to, on the one hand, enable a fluidic isolation of the first coolant chamber from the second coolant chamber and, on the other hand, to allow a heat transfer between the first coolant chamber and the second coolant chamber. This allows for a good heat transfer. For example, the first partition can be configured as a continuous partition, or it can also be formed at least in sections by one of the first high-voltage components.

According to a preferred embodiment, the partition comprises
on the side facing the first coolant chamber,
on the side facing the second coolant chamber, or
on the side facing the first coolant chamber and on the side facing the second coolant chamber a first structured surface in order to increase the overall surface compared to a smooth surface. The heat transfer can be greatly improved by such a structured surface.

According to a preferred embodiment, the first coolant chamber is closed within the first housing. This allows for a solution in which the second coolant chamber is connected to a coolant circuit and the first coolant chamber is locally provided.

According to a preferred embodiment, the apparatus comprises at least one propeller, which propeller is arranged in the first coolant chamber in order to bring about a flow of the first coolant. The cooling capacity can thereby be increased, and the housing can be designed compactly. The at least one propeller can influence the flow rate and/or direction of flow of the first coolant.

According to a preferred embodiment, a DC port and an AC port are provided on the first housing, each of which is fluidically sealed on the first housing. The risk of undesirable leakage of a coolant from the housing can thereby be reduced.

According to a preferred embodiment, the apparatus comprises a second housing, which second housing is provided in the first coolant chamber, in which second housing at least one of the first high-voltage components is arranged, and which second housing comprises at least in sections a second structured surface in order to bring about a good heat transfer between the second housing and the first coolant. In high-voltage components with strong heat generation, the heat transfer can thereby be improved.

According to a preferred embodiment, the first coolant chamber comprises at least one coolant conduit extending through the second coolant chamber in such a way that the coolant conduit is completely surrounded by the second coolant chamber at least in sections. The heat transfer can be significantly increased by such a coolant conduit.

According to a preferred embodiment, the apparatus comprises a drying chamber and an isolation assembly, which isolation assembly is configured so as to fluidically isolate the drying chamber from the first coolant chamber, wherein the pulse inverter comprises second electrical conduits, which second electrical conduits extend from the first coolant chamber via the isolation assembly to the drying chamber, and wherein the passage of the second electrical conduits is fluidically sealed by the isolation assembly in such a way that the first coolant does not enter the drying chamber. Such a drying chamber simplifies the assembly of sensitive components or other components that produce little heat. The specific subdivision into the first coolant chamber and the drying chamber can be selected by the person skilled in the art depending on the size of the individual components and their power dissipation ability and heat energy generation.

According to a preferred embodiment, the first high-voltage components comprise first electrical conduits that run at least in sections openly through the first coolant chamber in order to allow for a good cooling of the first electrical conduits by the first coolant. The open-ended electrical conduits can be well cooled by the coolant, thereby reducing a heat transfer between the high-voltage components.

According to a preferred embodiment, the first high-voltage components are in contact with the first partition at least in sections and/or form it at least in sections. This allows for a comparatively direct heat transfer between the second coolant chamber and the first high-voltage component.

According to a preferred embodiment, the first high-voltage components are at least partially spaced apart from the first partition. This allows for a heat transfer through the first coolant in the region between the first high-voltage component and the first partition, which is advantageous for example in the case of rough surfaces of the first high-voltage components or low mechanical surface area.

A vehicle comprises such a cooling system and such an apparatus.

According to a preferred embodiment, in the vehicle, the cooling system and the second coolant chamber form a coolant circuit. The cooling capacity can thereby be greatly increased.

Further details and advantageous further developments of embodiments of the invention will emerge from the embodiment examples, which are described below and illustrated in the drawings and are not to be construed as limiting the invention in any way. It goes without saying that the features mentioned above and those yet to be discussed below can be used not only in the respectively specified combination, but also in other combinations or on their own, without leaving the scope of the present invention.

Parts that are the same or have the same effect bear the same reference numbers in the following and are generally described only once. The descriptions of all of the figures build on one another in order to avoid unnecessary repetitions.

FIG. 1 shows a schematic illustration of a vehicle 10. The vehicle 10 has a cooling system 12 and an apparatus 20.

For example, the cooling system 12 comprises a coolant pump, a heat exchanger, coolant conduits, and a coolant 46.

The apparatus 20 has a housing 21 and a pulse inverter 30. The pulse inverter 30 is arranged in the housing 21 and comprises high-voltage components 31, 32, 35, 36, 37, 38.

The housing 21 comprises a first coolant chamber 41 and a second coolant chamber 42. The second coolant chamber 42 is fluidically isolated from the first coolant chamber 41.

The first coolant chamber 41 comprises a coolant 45, which is a dielectric coolant. Examples of this are coolant based on monoethylene glycol or based on a mixture of methyl nonafluoro-n-butylether with methyl nonafluoro-isobutylether, which is sold as a coolant called R-7100, or based on hydrofluoroether, which is sold as a coolant called HFE-7100, are suitable.

The second coolant chamber 42 preferably comprises a coolant 46, which is a dielectric coolant or a non-dielectric coolant. For example, a non-dielectric coolant can comprise water and antifreeze, or glycol.

The high-voltage components 31, 32 are arranged in the first coolant chamber 41.

The housing 21 has a coolant port 51 and a coolant port 52. The coolant port 51 is in fluid communication with the second coolant port 52 via the second coolant chamber 42. This allows for a fluid flow of the coolant 46 from the coolant port 51 via the second coolant chamber 42 to the coolant port 52.

In the embodiment example, the cooling system 12 and the second coolant chamber 42 form a coolant circuit 14.

The apparatus 20 has a partition 22 that is provided between the first coolant chamber 41 and the second coolant chamber 42. This allows for a fluidic isolation of the first coolant chamber 41 from the second coolant chamber 42, on the one hand, and a heat transfer between the first coolant chamber 41 and the second coolant chamber 42, on the other hand.

The high-voltage components in the first coolant chamber 41 preferably comprise the intermediate circuit capacitor 31 or an intermediate circuit capacitor assembly 31, the power module 32, electrical conduits 35, 37 (on the DC side), 36 (on the AC side), and generally semiconductor switches or transistors, as an example of which a semiconductor switch 38 is shown.

The AC side of the pulse inverter is preferably configured so as to be multi-phase, in particular three-phase or five-phase.

A semiconductor switch activation apparatus 81 and a control apparatus 82 are arranged in the embodiment example outside of the first coolant chamber 41, but can also be provided in the first coolant chamber 41. The semiconductor switch activation apparatus 81 and the control apparatus 82 in the embodiment example have a schematically indicated common printed circuit board.

The semiconductor switch activation apparatus 81 generates the activation signals for the semiconductor switches in the power module 32. In MOSFET semiconductor switches, the semiconductor switch activation apparatus 81 is also referred to as a gate driver apparatus.

The first coolant chamber 41 is closed within the housing 21 in the embodiment example. Thus, it does not have any open fluid ports. This is advantageously possible because heat can be efficiently dissipated via the coolant 46 in the second coolant chamber 42.

A DC port 25 and an AC port 26 are provided on the housing 21, and they are preferably fluidically sealed on the housing 21 so that the coolant 45 does not leak out of the housing 21.

The housing 21 comprises a drying chamber 43 and an isolation assembly 27, which isolation assembly 27 is configured so as to fluidically isolate the drying chamber 43 from the first coolant chamber 41.

The pulse inverter 30 comprises electrical conduits 84 that extend from the first coolant chamber 41 via the isolation assembly 27 to the drying chamber 43. The passage of the second electrical conduits 84 through the isolation assembly 27 is fluidically sealed in order to prevent the first coolant 45 from entering the drying chamber 43.

In the embodiment example, the electrical conduits 84 run between the semiconductor switch activation apparatus 81 and the power module 32 and allow for an activation of semiconductor switches 38 in the power module 32 by the semiconductor switch activation apparatus 81.

A housing 33 is provided in the first coolant chamber 41, and power module 32 is provided in the housing 33. On the one hand, the housing 33 allows for a sealing of the electrical components of the power module 32 against the first coolant chamber 41, to the extent required, and on the other hand, the surface of the power module 32 can be enlarged towards the first coolant chamber 41 by the housing 33.

The semiconductor switches 38 are preferably silicon carbide semiconductor switches, because the latter generate comparatively little heat loss.

Preferably, the electrical conduits 35, 36, 37 run at least in sections openly through the first coolant chamber 41 in order to allow for a good cooling of the first electrical conduits 35, 36, 37 by the coolant 45. Preferably, the electrical conduits 35, 36, 37 are thus not spaced apart from the coolant 45 by a cladding, but rather run directly through the coolant chamber 41. Typically, an insulating layer is provided on the electrical conduits 35, 36, 37, for example a varnish layer. However, these are very thin layers, which are typically less than 2 mm, further preferably less than 1 mm, and particularly preferably less than 0.5 mm. For this reason, the heat transfer from the electrical conduits 35, 36, 37 to the coolant 45 is not significantly reduced by such a coating. However, a common cladding of multiple electrical conduits 35, 36, 37, which is over 1 cm thick, for example, would significantly reduce the cooling effect.

The good cooling of the electrical conduits 35, 36, 37, for example comprising copper or a copper alloy, prevents or reduces a heat transfer between the high-voltage components 31 and 32, which is also referred to as the external heat transfer.

Preferably, as the additional high-voltage components, current sensors measuring the current in at least one of the electrical conduits 35, 36, 37 are provided. For this purpose, the current sensors are preferably provided on at least one of the conduits 35, 36, 37.

In addition, filter assemblies can be provided as additional high-voltage components comprising, for example, X capacitors, Y capacitors, and/or throttles can be provided. Such filter assemblies can be provided on the DC side and/or the AC side of the pulse inverter 30.

The high-voltage components 31, 32 (via the housing 33) are in contact with the partition 22. This allows for a comparatively direct heat transfer between the second coolant chamber 42 and the respective high-voltage component 31, 33.

In the overall concept, the dielectric coolant 45 allows for a good and comparatively direct cooling of the high-voltage components 31, 32, 35, 36, 37 in the first coolant chamber 41, and an electrical short circuit is prevented. Providing the second coolant chamber 42 with the coolant 46 effectively dissipates the heat, and the coolant 46 can cool the coolant 45, or directly the high-voltage components 31, 32, etc., via the partition 22.

Preferably, all high-voltage components of the pulse inverter 30 are provided in the first coolant chamber 41 and can be well cooled therewith. If the drying chamber 43 is provided, this preferably only provides low-voltage components, such as the control apparatus 82.

The term high-voltage, which comes from vehicle technology, is a system that operates with AC voltages over 30 V to 1.0 kV or with DC voltages over 60 V to 1.5 kV. The term low-voltage (short NV) is a system that operates with AC voltages up to and including 30 V or DC voltages up to and including 60 V.

The apparatus 20 is preferably configured so as to bring about the flow of the coolant 46 through the second fluid chamber 42 such that the coolant 46 first flows on the DC side of the pulse inverter 30 and only thereafter on the AC side of the pulse inverter 30. This is advantageous on the one hand for the pulse inverter 30 in terms of cooling technology. The still cool coolant 46 can initially cool the intermediate circuit capacitor 31, and this is particularly advantageous for the lifetime of the pulse inverter 30. On the other hand, the coolant 46 on the AC side of the pulse inverter 30 can be passed onto and cool an electric machine. This allows for a compact overall design.

Figure 2:
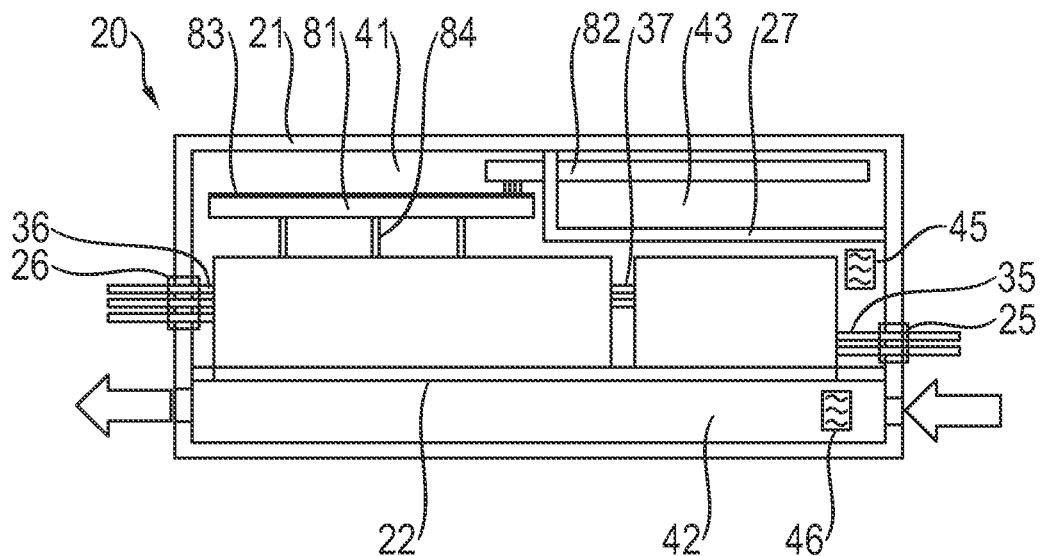
FIG. 2 illustrates, in a schematic longitudinal section, an embodiment of the apparatus with a pulse inverter.

FIG. 2 shows a further embodiment of the apparatus 20. Here, the drying chamber 43 is configured differently than in the embodiment of FIG. 1. The semiconductor switch activation apparatus 81 is provided in the first coolant chamber 41, and this allows for an assembly of the semiconductor switch activation apparatus 81 in spatial proximity to the power module 32. A low-inductive construction with advantageous electrical properties can thereby be achieved.

Preferably, the semiconductor switch activation apparatus 81 and/or other high-voltage components 31, 32, 35, 36, 37 have a coating 83 configured so as to provide a protection against the coolant 45. A thin plastic layer or a varnish is suitable, for example.

The coating 83 can be provided in full coverage or in sections.

In the embodiment example, the control apparatus 82 extends into both the drying chamber 43 and the first coolant chamber 41. This facilitates contacting, wherein the sealing function of the isolation assembly 27 must be realized in the region of control apparatus 82, for example by a rubber seal. In a configuration of the control apparatus 82 with a printed circuit board, this can be done as an overall concept with the formation of a seal on the printed circuit board.

Figure 3:
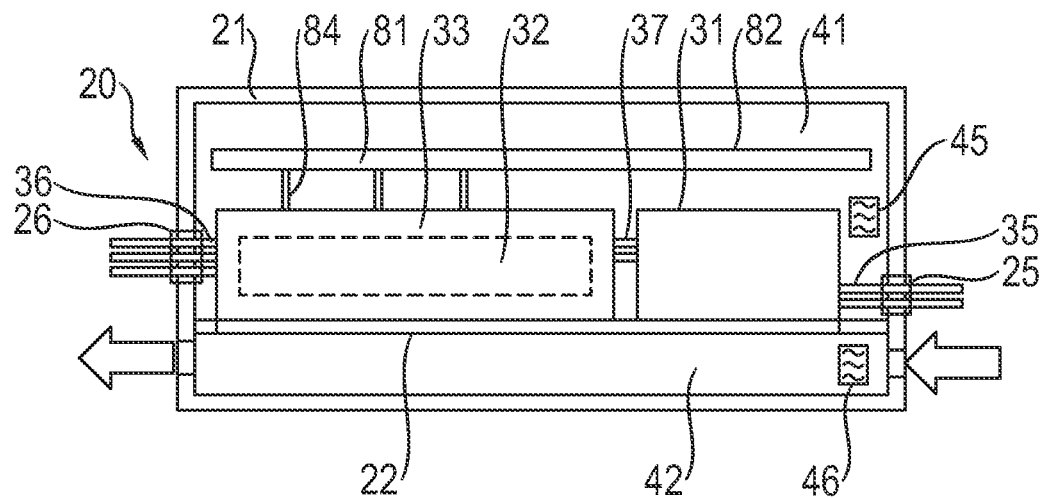
FIG. 3 illustrates, in a schematic longitudinal section, an embodiment of the apparatus with a pulse inverter.

FIG. 3 shows a further embodiment of the apparatus 20. The apparatus 20 in this embodiment example does not have a drying chamber, and all electrical components of the pulse inverter 30 are preferably arranged in the first coolant chamber 41. This facilitates assembly, and all electrical components 31, 32, 35, 36, 37, 81, 82, 84 can be arranged proximate to each other.

Figure 4:
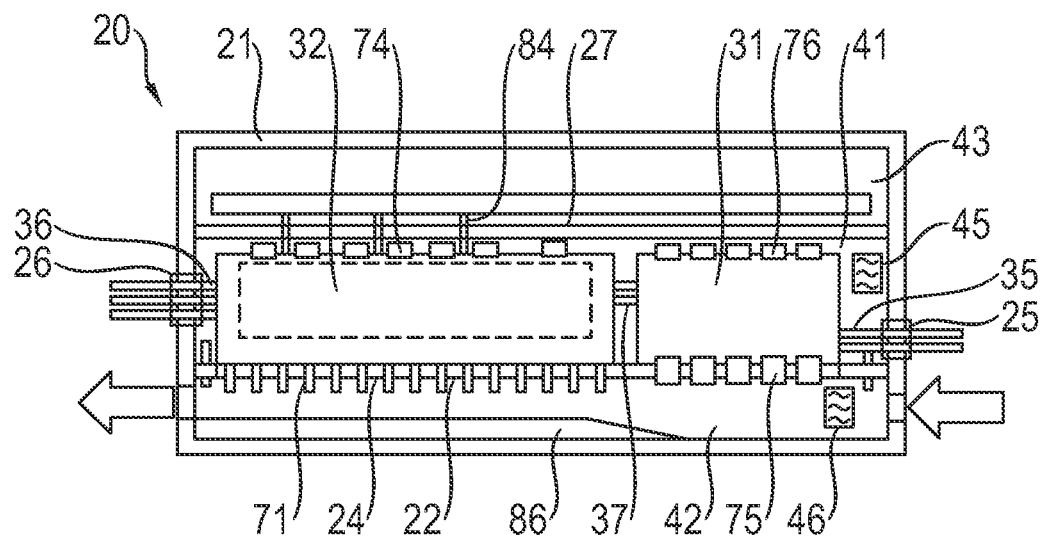
FIG. 4 illustrates, in a schematic longitudinal section, an embodiment of the apparatus with a pulse inverter.

FIG. 4 shows a further embodiment of the apparatus 20, which corresponds to the basic concept of the embodiment of FIG. 1. In order to improve the transfer of heat to the coolant 45 and/or the coolant 46, structured surfaces 71, 74, 75, 76 are provided at different points on the apparatus 20. This increases the overall surface region compared to a smooth surface and thus also increases the heat transfer. The partition 22 has the structured surface 71 on the side 24 facing the second coolant chamber 42, and the high-voltage electrical components 31, 32 have the structured surfaces 74, 76 on the side facing the first coolant chamber 41 at least in sections. This allows for a good heat transfer to the coolant 45 and/or the coolant 46. The structured surfaces 71, 74, 75, 76 can be protrusions, for example in the form of pins or blades. Preferably, these are laminar structures and can be produced, for example, by means of 3D printing.

In the embodiment example, the high-voltage components 31, 32 form the partition 22 in sections in that the protrusions are formed through the high-voltage components 31, 32 and project into the second coolant chamber 42.

A flow guide 86 is provided in the second coolant chamber 42, which, in the region adjacent to at least one of the high-voltage components 32, 36, 37, brings about a reduction of the cross-section and thus an increase in the flow rate of the coolant 46, which leads to an increase in the cooling capacity in this region.

Figure 5:
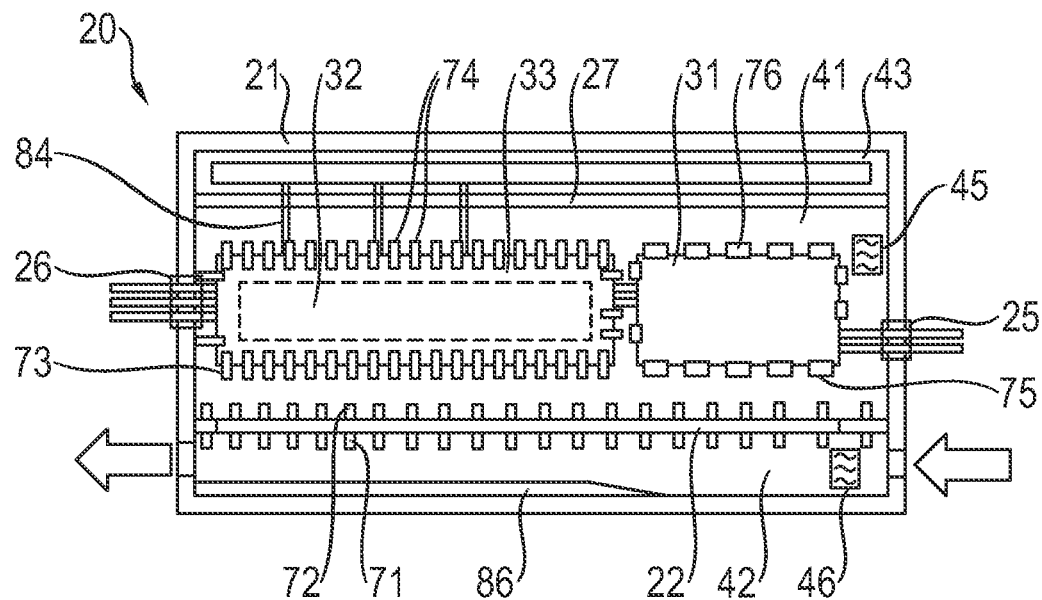
FIG. 5 illustrates, in a schematic longitudinal section, an embodiment of the apparatus with a pulse inverter.

FIG. 5 shows further embodiments of the apparatus 20. By contrast to the embodiment of FIG. 4, the partition 22 has a structured surface 72 on the side 23 facing the first coolant chamber 41. The high-voltage components 31, 32 are spaced apart from the partition 22 at least in sections and have surfaces 73 that are structured at least in sections on the sides facing the partition 22. This allows for an advantageous transfer of heat from the high-voltage components 31, 32 to the coolant 45. In addition, the coolant 45 can be in contact with the partition 22 over a large surface area, and this allows for a good heat transfer from the coolant 45 to the partition 22 and thus to the coolant 46.

The semiconductor switch activation apparatus 81 and the control apparatus 82 are provided in the drying chamber 43 like in the embodiment example of FIG. 4 and are connected to the power module 32 via electrical conduits 84.

Figure 6:
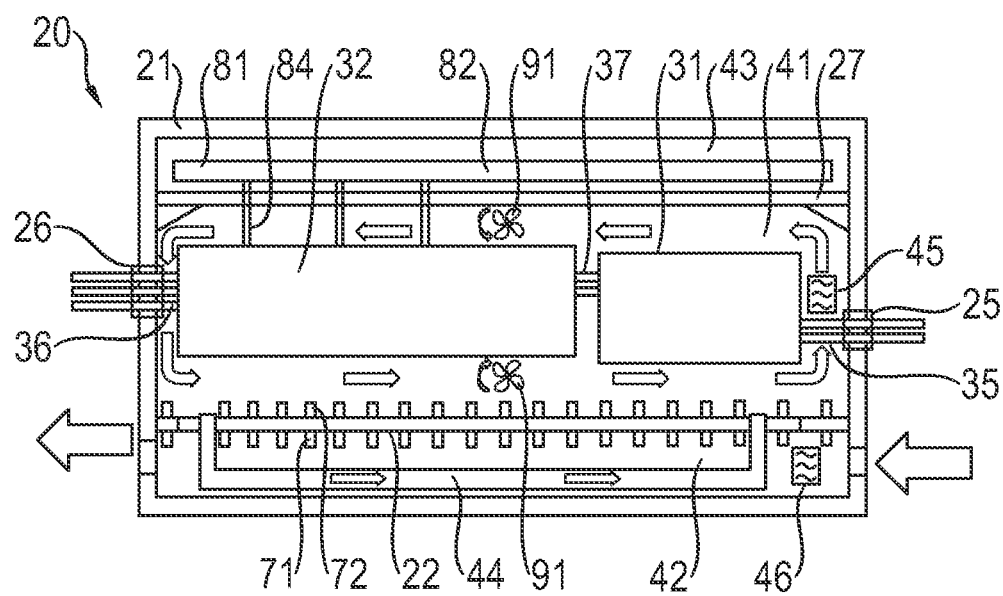
FIG. 6 illustrates, in a schematic longitudinal section, an embodiment of the apparatus having a pulse inverter.

FIG. 6 shows a further embodiment of the apparatus 20. This embodiment example basically corresponds to the embodiment example of FIG. 5.

Propellers 91 are preferably provided in the first coolant chamber 41 in order to cause a flow of the coolant 45. With the flow or circulation of the coolant 45, a greater cooling capacity can be achieved, and this results in better cooling of the coolant 45 and thus also of the high-voltage components 31, 32, 35, 36, 37, etc.

Preferably, the first coolant chamber 41 comprises one or more coolant conduits 44 extending through the second coolant chamber 42 in such a way that the coolant conduits 44 are completely surrounded by the second coolant chamber 42 at least in sections. This allows for a good heat exchange between the first coolant 45 and the second coolant 46.

Many variants and modifications are of course possible within the scope of embodiments of the invention.

Some of the embodiment examples disclose multiple technical solutions. These are all advantageous even in a unique setting, and the person skilled in the art can choose and combine the solution suitable for his or her purposes with other solutions.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An apparatus comprising:
   a first housing; and
   a pulse inverter,
   wherein the pulse inverter is arranged in the first housing, and comprises first high-voltage components,
   wherein the first housing comprises a first coolant chamber and a second coolant chamber,
   wherein the second coolant chamber is fluidically isolated from the first coolant chamber,
   wherein the first coolant chamber comprises a first coolant,
   wherein the first coolant is a dielectric coolant,
   wherein the first high-voltage components are arranged in the first coolant chamber,
   wherein the first housing comprises a first coolant port and a second coolant port, and
   wherein the first coolant port is in fluid communication with the second coolant port via the second coolant chamber in order to allow a fluid flow of a second coolant from the first coolant port via the second coolant chamber to the second coolant port.

2. The apparatus according to claim 1, wherein the first high-voltage components comprise at least one high-voltage component including at least one of:
   a power module,
   a semiconductor switch,
   a semiconductor switch activation apparatus,
   a control apparatus,
   a first electrical conduit,
   an intermediate circuit capacitor,
   a current sensor, and/or
   a filter assembly.

3. The apparatus according to claim 2, wherein the first high-voltage components comprise at least one high-voltage component comprising a coating configured so as to bring about a protection of the high-voltage component from the first coolant.

4. The apparatus according to claim 1, wherein the second coolant is provided in the second coolant chamber.

5. The apparatus according to claim 4, wherein the second coolant comprises a dielectric coolant or a non-dielectric coolant.

6. The apparatus according to claim 1, comprising a first partition, wherein the first partition is provided between the first coolant chamber and the second coolant chamber in order to, on the one hand, enable a fluidic isolation of the first coolant chamber from the second coolant chamber and, on the other hand, to allow a heat transfer between the first coolant chamber and the second coolant chamber.

7. The apparatus according to claim 6, wherein the partition comprises:
   on a side facing the first coolant chamber,
   on a side facing the second coolant chamber, or
   on a side facing the first coolant chamber and on the side facing the second coolant chamber,
   a first structured surface in order to increase an overall surface compared to a smooth surface.

8. The apparatus according to claim 1, wherein the first coolant chamber is closed within the first housing.

9. The apparatus according to claim 1, comprising at least one propeller, wherein the propeller is arranged in the first coolant chamber in order to bring about a flow of the first coolant.

10. The apparatus according to claim 1, wherein a DC port and an AC port are provided on the first housing, and are respectively fluid-tightly sealed on the first housing.

11. The apparatus according to claim 1, wherein the first coolant chamber comprises a coolant conduit,
   wherein the coolant conduit extends through the second coolant chamber such that the coolant conduit is completely surrounded by the second coolant chamber at least in sections.

12. The apparatus according to claim 1, comprising:
   a drying chamber; and
   an isolation assembly,
   wherein the isolation assembly is configured to fluidically isolate the drying chamber from the first coolant chamber,
   wherein the pulse inverter comprises electrical conduits that extend from the first coolant chamber via the isolation assembly to the drying chamber, and
   wherein a passage of the electrical conduits is fluidically sealed by the isolation assembly such that the first coolant does not enter the drying chamber.

13. A vehicle comprising a cooling system and the apparatus according to claim 1, wherein the cooling system and the second coolant chamber form a coolant circuit in the vehicle.

14. An apparatus comprising:
   a first housing;
   a second housing; and
   a pulse inverter,
   wherein the pulse inverter is arranged in the first housing, and comprises first high-voltage components,
   wherein the first housing comprises a first coolant chamber and a second coolant chamber,
   wherein the second coolant chamber is fluidically isolated from the first coolant chamber,
   wherein the first coolant chamber comprises a first coolant,
   wherein the first coolant is a dielectric coolant,
   wherein the first high-voltage components are arranged in the first coolant chamber,
   wherein the first housing comprises a first coolant port and a second coolant port,
   wherein the first coolant port is in fluid communication with the second coolant port via the second coolant chamber in order to allow a fluid flow of a second coolant from the first coolant port via the second coolant chamber to the second coolant port,
   wherein the second housing is provided in the first coolant chamber,
   wherein at least one of the first high-voltage components is arranged in the second housing, and
   wherein the second housing comprises at least in sections a second structured surface to bring about a heat transfer between the second housing and the first coolant.

15. The apparatus according to claim 14, comprising at least one propeller, wherein the propeller is arranged in the first coolant chamber in order to bring about a flow of the first coolant.

16. The apparatus according to claim 14, comprising:
   a drying chamber; and
   an isolation assembly, wherein the isolation assembly is configured to fluidically isolate the drying chamber from the first coolant chamber, wherein the pulse inverter comprises electrical conduits that extend from the first coolant chamber via the isolation assembly to the drying chamber, and wherein a passage of the electrical conduits is fluidically sealed by the isolation assembly such that the first coolant does not enter the drying chamber.

17. The apparatus according to claim 14, wherein the first high-voltage components comprise first electrical conduits that run at least in sections openly through the first coolant chamber to allow for a cooling of the first electrical conduits by the first coolant.

18. An apparatus comprising:
a first housing; and
a pulse inverter,
wherein the pulse inverter is arranged in the first housing, and comprises first high-voltage components,
wherein the first housing comprises a first coolant chamber and a second coolant chamber,
wherein the second coolant chamber is fluidically isolated from the first coolant chamber,
wherein the first coolant chamber comprises a first coolant,
wherein the first coolant is a dielectric coolant,
wherein the first high-voltage components are arranged in the first coolant chamber,
wherein the first housing comprises a first coolant port and a second coolant port,
wherein the first coolant port is in fluid communication with the second coolant port via the second coolant chamber in order to allow a fluid flow of a second coolant from the first coolant port via the second coolant chamber to the second coolant port, and
wherein the first high-voltage components comprise first electrical conduits that run at least in sections openly through the first coolant chamber to allow for a cooling of the first electrical conduits by the first coolant.

19. The apparatus according to claim 18, comprising at least one propeller, wherein the propeller is arranged in the first coolant chamber in order to bring about a flow of the first coolant.

20. The apparatus according to claim 18, comprising:
a drying chamber; and
an isolation assembly,
wherein the isolation assembly is configured to fluidically isolate the drying chamber from the first coolant chamber,
wherein the pulse inverter comprises second electrical conduits that extend from the first coolant chamber via the isolation assembly to the drying chamber, and
wherein a passage of the second electrical conduits is fluidically sealed by the isolation assembly such that the first coolant does not enter the drying chamber.

* * * * *